(12) United States Patent
Ueno et al.

(10) Patent No.: US 6,518,639 B2
(45) Date of Patent: *Feb. 11, 2003

(54) SOLID STATE IMAGING DEVICE

(75) Inventors: Hidehiro Ueno, Kagoshima (JP); Yuuichi Okazaki, Kanagawa (JP); Hiroyuki Mori, Kagoshima (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,496

(22) Filed: Jun. 29, 1998

(65) Prior Publication Data

US 2001/0054743 A1 Dec. 27, 2001

(51) Int. Cl.$^7$ ............... H01L 27/148; H01L 31/0232
(52) U.S. Cl. .................................. 257/432; 257/233
(58) Field of Search ................... 257/222, 232, 257/233, 432

(56) References Cited

U.S. PATENT DOCUMENTS

| | | | | | |
|---|---|---|---|---|---|
| 5,204,138 A | * | 4/1993 | Nguyen et al. | ............ | 427/578 |
| 5,306,906 A | * | 4/1994 | Aoki et al. | ............ | 257/222 |
| 5,479,049 A | * | 12/1995 | Aoki et al. | ............ | 257/233 |
| 5,654,565 A | * | 8/1997 | Hokari | ............ | 257/222 |
| 5,691,548 A | * | 11/1997 | Akio | ............ | 257/432 |

* cited by examiner

Primary Examiner—Gene M. Munson
(74) Attorney, Agent, or Firm—Sonnenschein, Nath & Rosenthal (57) ABSTRACT

There is provided a solid state imaging device which has been improved in-to-noise characteristics and sensitivity and which can be fabricated with high yield. In a solid state imaging device (1) including a light receiving portion (2) having an opening portion (7) formed as a pixel, a low reflection (9) film is formed on the opening portion of the light receiving portion. Light beams ($L_F$) incident upon the light receiving portion is a plurality of colors selected for respective pixels. The low reflection film has a film thickness or a refractive index selected for each pixel so as to correspond to a color of the light ($L_F$) incident upon the light receiving portion (2).

7 Claims, 6 Drawing Sheets

SOLID STATE IMAGING DEVICE

BACKGROUND OF THE INVENTION

The present invention relates to a solid state imaging device including a light receiving portion having an opening portion formed thereon, such as a CCD solid state imaging device or the like.

In the solid state imaging device, the optical system thereof tends to become as small as ⅓ inch or ¼ inch. In correspondence with the reduction in size and the increase in number of pixels in the solid state imaging devices, the opening of the light receiving portion is becoming smaller.

If the opening of the light receiving portion is expanded for the purpose of improving the sensitivity, the smear becomes apt to occur because of light incidence upon the charge transfer portion. Therefore, there is a limit in making the opening of the light receiving portion larger.

Furthermore, if it is attempted to improve the sensitivity by electrically amplifying the signal charge obtained by the photoelectric conversion of incident light on the light receiving portion, the influence of noise upon the signal value also becomes large and the signal-to-noise characteristic is deteriorated.

In the device fabrication, white points are caused by a crystal defect of the semiconductor substrate or contamination in the fabrication process and so on. As for the white points, minute white points which cannot be completely controlled even now and white points of a level which has not been regarded as defective until now exert a great influence. This results in a problem of reduction in yield.

SUMMARY OF THE INVENTION

In order to solve the above described problems, an object of the present invention is to provide a solid state imaging device which has been improved in signal-to-noise characteristics and sensitivity and which can be fabricated with high yield.

A solid state imaging device according to the present invention includes light receiving portions having opening portions formed as pixels, and low reflection films formed over the opening portions of the light receiving portions, wherein lights incident upon the light receiving portions have a plurality of colors selected for respective pixels, and the low reflection film has a film thickness or a refractive index selected for each pixel so as to correspond to a color of a light incident upon the light receiving portion.

Another solid state imaging device according to the present invention includes light receiving portions having opening portions formed as pixels, and low reflection films formed over the opening portions of the light receiving portions, and films disposed over the low reflection films to supply hydrogen.

In the above described configuration of the present invention, the proportion of the light incident upon the light receiving portion being reflected is reduced by providing the low reflection films on the light receiving portion. Thus, it is possible to reduce the proportion of light reflected and let off from the light receiving portion and increase the amount of received light. Therefore, the sensitivity of the solid state imaging device can be improved.

Furthermore, lights incident upon the light receiving portions have a plurality of colors selected for respective pixels, and the low reflection film has a film thickness or a refractive index selected for each pixel so as to correspond to a color of a light beam incident upon the light receiving portion. As a result, the sensitivity can be optimized for each color.

According to the above described another configuration, films for supplying hydrogen are disposed over the low reflection films. Thereby, it is possible to supply hydrogen to the surface of the substrate and lower the interface level.

In accordance with the present invention, a solid state imaging device includes light receiving portions having opening portions formed as pixels, and low reflection films formed over the opening portions of the light receiving portions, wherein lights incident upon the light receiving portions have a plurality of colors selected for respective pixels, and the low reflection film has a film thickness or a refractive index selected for each pixel so as to correspond to a color of a light beam incident upon the light receiving portion.

In accordance with the present invention, in the solid state imaging device described above, the film thickness of the low reflection films having same refractive index is changed pixel by pixel so as to correspond to the color of the light beam incident upon the light receiving portion.

In accordance with the present invention, in the solid state imaging device described above, the low reflection films are formed by a plurality of films having different refractive indexes, and the refractive index of the low reflection films is changed pixel by pixel so as to correspond to the color of the light beam incident upon the light receiving portion.

In accordance with the present invention, in the solid state imaging device described above, the film thickness and refractive index of the low reflection films are changed pixel by pixel so as to correspond to the color of the light beam incident upon the light receiving portion.

In accordance with the present invention, a solid state imaging device includes light receiving portions having opening portions formed as pixels, and low reflection films formed over the opening portions of the light receiving portions, and films disposed over the low reflection films to supply hydrogen.

In accordance with the present invention, in the above-mentioned solid state imaging device, the low reflection films are formed so as to be narrower in width than the opening portions of the light receiving portions.

In accordance with the present invention, the abovementioned solid state imaging device has such a configuration that in pixels of a central portion each of the low reflection films is formed in center of the opening portions of the light receiving portions, whereas in pixels of peripheral portions each of the low reflection films is formed so as to be displaced from the center of the opening portions of the light receiving portions to the outside.

DESCRIPTION OF THE PREFERRED EMBODIMENTS

Hereafter, embodiments of a solid state imaging device according to the present invention will be described.

Figure 1:
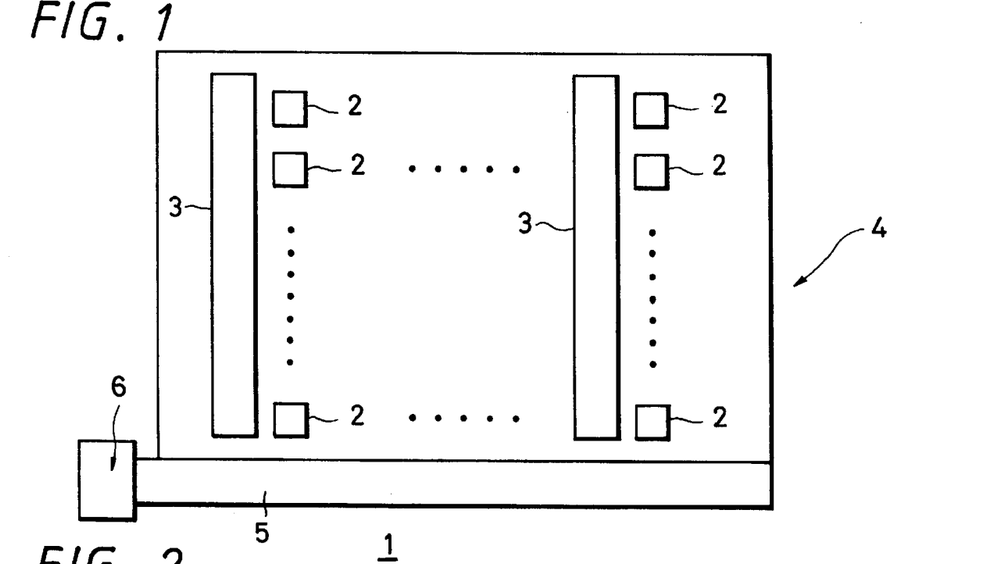
FIG. 1 is a schematic configuration diagram (plan view) of a CCD solid state imaging device according to the present invention.

A CCD solid state imaging device 1 shown in FIG. 1 includes an imaging region 4 and a horizontal transfer CCD register 5. The imaging region 4 is formed of photosensors 2 and vertical transfer CCD registers 3. The photosensor 2 for conducting photoelectric conversion forms a light receiving portion. The horizontal transfer CCD register 5 transfers signal charge transferred from the vertical transfer CCD registers 3 to an output portion 6.

Figure 2:
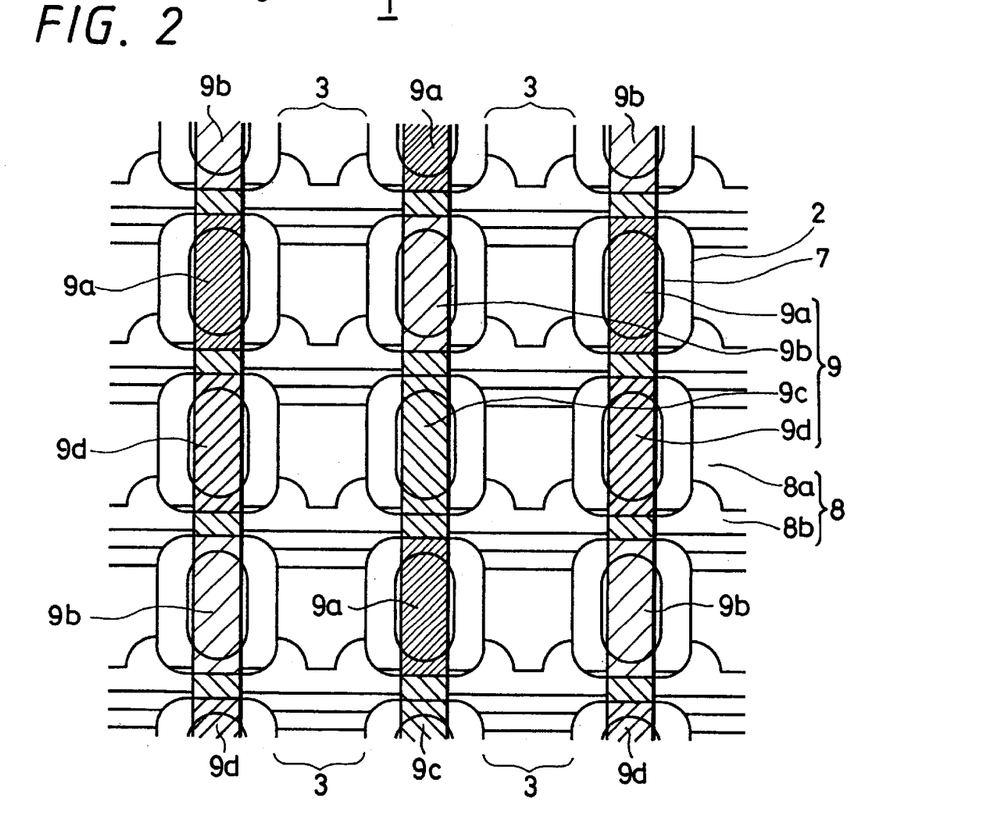
FIG. 2 is an enlarged view of an imaging region of the CCD solid state imaging device shown in FIG. 1.

FIG. 2 is an enlarged view of the imaging region 4 of the CCD solid state imaging device 1 shown in FIG. 1.

In the CCD solid state imaging device 1 which includes opening portions 7 each formed by an opening of a light shielding film made of, for example, Al formed on a light receiving portion 2 having an incident light receiving photosensor, and transfer electrodes 8 (8a, 8b) made of polycrystalline silicon for conducting reading and transfer operation, low reflection films 9 (9a, 9b, 9c and 9d) for suppressing the reflection are provided on the opening portions 7.

By providing the low reflection films 9, the sensitivity can be improved.

In the embodiment shown in FIG. 2, the low reflection films 9 are provided to be extended in the vertical direction so as to be parallel to the vertical transfer registers 3. So as to correspond to the four colors of color filters (not illustrated) disposed on the respective photosensors 2, i.e., magenta, cyanogen, yellow and green of complementary color system, low reflection films of four kinds 9a, 9b, 9c and 9d each changed in a film thickness and refractive index are provided as will he described later. As for the low reflection films between adjacent photosensors 2 in the vertical direction, conditions such as the film thickness, refractive index and so on are arbitrary. In FIG. 2, however, the same conditions as those of one (9c) of the four kinds of the low reflection films are used.

Although not illustrated, a color filter, an on-chip lens and so on are formed on the photosensor 2 of the light receiving portion of each device.

Figure 3A:
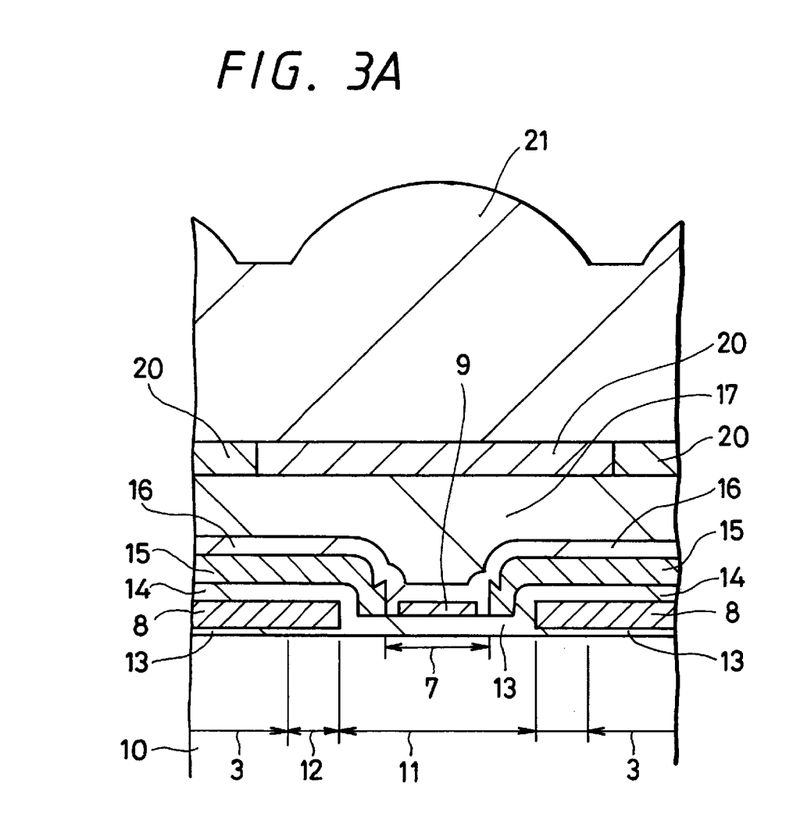
FIG. 3A is a sectional view of FIG. 2 near a light receiving portion in the horizontal direction.
Figure 3B:
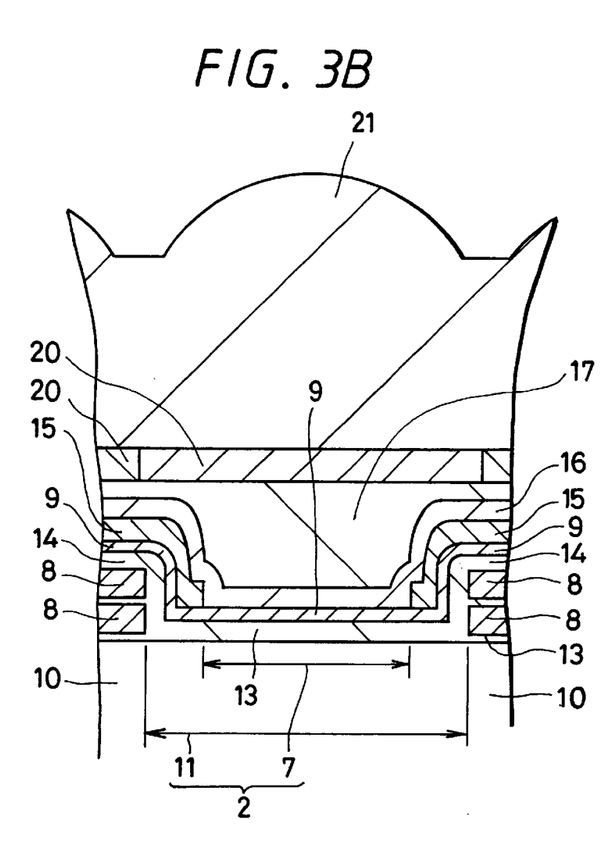
FIG. 3B is a sectional view of FIG. 2 near the light receiving portion in the vertical direction.

FIG. 3A is a sectional view of FIG. 2 in the horizontal direction (i.e., so-called H direction). FIG. 3B is a sectional view of FIG. 2 in the vertical direction (i.e., so-called V direction).

Although not illustrated, semiconductor regions forming charge storage portions 11, transfer channel regions forming the vertical transfer registers 3, read gate portions 12, channel stop regions and so on are formed on a semiconductor substrate 10.

On the surface of the semiconductor substrate 10, an insulation film 13 one part of which serves as a gate insulation film is formed. Via the insulation film 13, transfer electrodes 8 are formed on a transfer channel region and the read gate portion 12. An interlayer insulation layer 14 is formed entirely so as to cover the transfer electrodes 8. By the transfer electrode 8, the insulation film 13, and the transfer channel region, the vertical transfer register 3 of the CCD structure is formed. On the interlayer insulation layer 14, a light shielding film 15 for shielding light directed toward other portions except the light receiving portion 2, and a protective film 16 are successively formed. Thereon, a planarization film 17 is formed. The light shielding film 15 is formed by, for example, a metal or the like. In portions of the light shielding film 15 corresponding to the light receiving portions 2, openings are formed. The openings correspond to the opening portions 7 of the light receiving portions 2.

On the planarization film 17, color filters 20 for transmitting a light of a specific color and an on-chip lenses 21 each worked in a spherical form to focus light are formed.

In the present embodiment, as described above, the low reflection film 9 is formed on the opening portions 7 of the light receiving portions 2. The low reflection film 9 is formed between the insulation film 13 and the guard film 16. In the horizontal direction, the low reflection films 9 are formed on the opening portions 7. In the vertical direction, the low reflection films 9 are formed on the interlayer insulation layer 14 formed on the transfer electrodes 8.

Figure 4A:
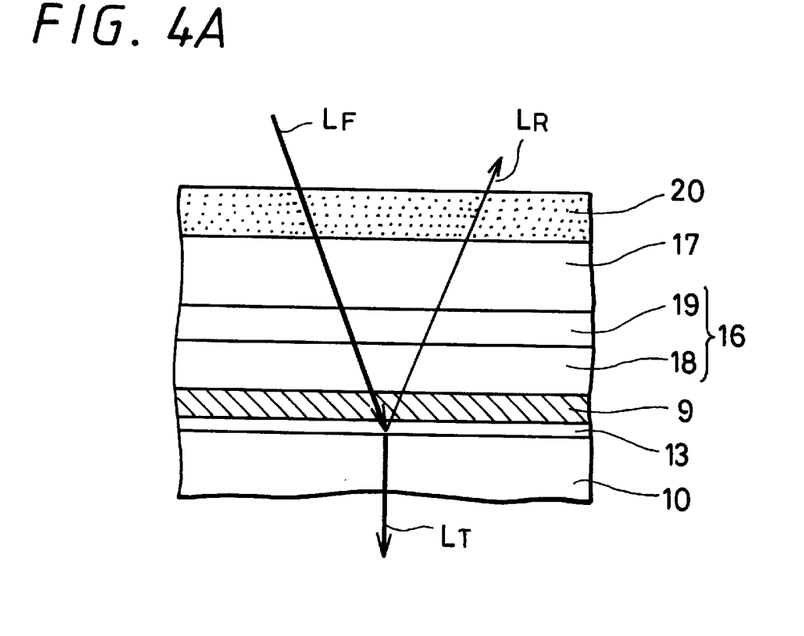
FIG. 4A is an enlarged view of FIG. 3 near an opening portion showing an example of formation of a low reflection film in the case where the low reflection film is a single layer.
Figure 4B:
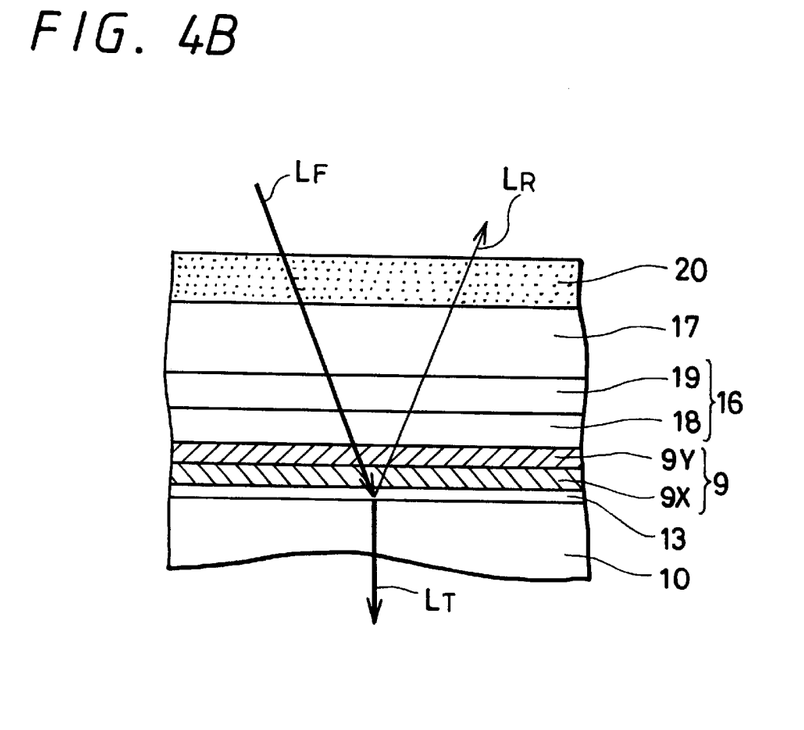
FIG. 4B is an enlarged view of FIG. 3 near the opening portion showing an example of formation of the low reflection film in the case where the low reflection film is a lamination of two layers.

Furthermore, a film supplying hydrogen may be formed in the upper layer of the low reflection layer 9 by using SiN (containing hydrogen due to plasma) formed by using the plasma CVD as the guard film 16, especially as an upper layer guard film 19 which will be described later (see FIG. 4), or using Al containing hydrogen as the light shielding film 15.

Thereby, it is possible to supply hydrogen to the semiconductor substrate 10 and reduce the interfacial level existing between the semiconductor substrate 10 and the insulation film 13 formed thereon.

Figure 8:
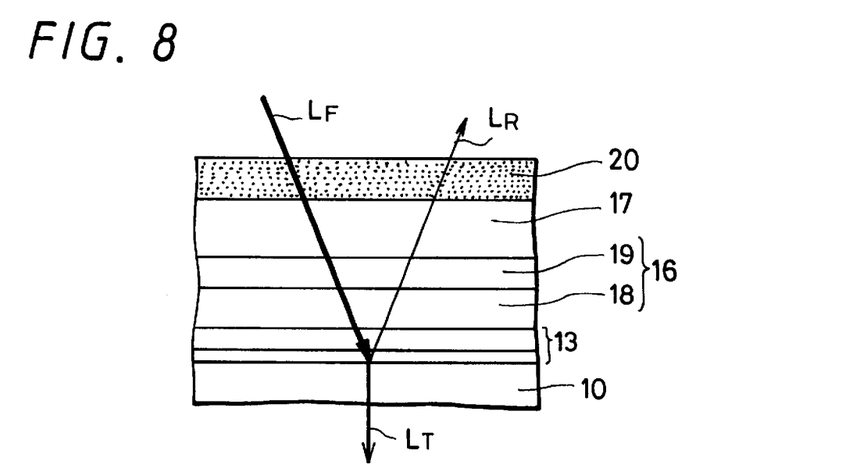
FIG. 8 is an enlarged view of a portion of a conventional CCD solid state imaging device located near an opening portion.

An enlarged view near the opening portion in the prior art is shown in FIG. 8. In the opening portion 7 of the photosensor 2 of a CCD solid state imaging device, an incident light $L_F$ passes through the color filter 20, the planarization film 17, the upper protective layer film 19, a lower protective layer film 18 formed by a PSG (phosphorous silicate glass) transparent protective film, and the insulation film 13 made of $SiO_2$ or the like to reach the semiconductor substrate 10. In the semiconductor substrate 10, approximately 25% of the incident light $L_F$ is reflected, resulting in a reflected light $L_R$.

An enlarged view near the opening portion in the present embodiment is shown in FIG. 4A. As shown in FIG. 4A, the low reflection film 9 is provided between the insulation film 13 and the protective film 16 formed by the lower protective layer film 18 and the upper protective layer guard layer 19. Thereby, the obstruction of the incident light $L_F$ by the reflected light $L_R$ is reduced, and by bringing a transmitted light $L_T$ into the semiconductor substrate 10 much, the sensitivity can be improved.

From the viewpoint of energy, but for energy attenuation in film transmission, reflection or the like, the following relation holds true: energy of incident light $L_F$=energy of transmitted light $L_T$+energy of reflected light $L_R$. If the reflection factor becomes approximately 2 to 3%, therefore, the sensitivity is improved by approximately 30%.

However, the film thickness causing low reflection changes depending upon the wavelength of the incident light $L_F$.

This changes depending upon the refractive index of the film and the color (wavelength) of the incident light $L_F$ in the same way as the interference of light in the thin film.

As for a representative element, an optical path length difference between the incident light $L_F$ and the reflected light $L_R$ the semiconductor substrate 10 might cause a phase delay. And the phase difference causing the amplification of the transmitted light $L_F$ is even times π in the low reflection film 9 and in the insulation film 13 made of $SiO_2$.

In other words, the following relation holds true.

$$\text{phase difference} = \{\pi(2nd)/(\lambda \cos \emptyset b)\} \times 2m$$

where n=refractive index of film d=film thickness

λ=wavelength

Øb=refractive index m=natural number.

As a matter of fact, the changes of the film thickness and the wavelength become complicated by multiple reflection caused by the multi-layer film structure including the insulation film 13, the upper protective layer guard film 19 or the like on the semiconductor substrate 10 and the focusing state or the like caused by the on-chip lens.

In the above described embodiment, the single layer low reflection films 9 having the same refractive index are provided from a point of view of the work efficiency.

In the case where the single layer low reflection films 9 having the same refractive index are used, only a specific color is amplified. As for other colors, there may be a possibility that a decreasing effect is caused on the contrary for some colors.

As shown in FIG. 2, for example, therefore, the film thickness is changed so as to correspond to the color for each color of the incident light $L_F$, i.e., for each sensor 2 provided that the films have the same refractive index. FIG. 2 shows the case where the film thickness is changed for the arrangement of the checkered pattern of complementary colors.

Furthermore, it is also possible to use films having different refractive indexes, overlap them so as to form two layers, and improve the sensitivity in each color. An enlarged view near the opening portion in this case is shown in FIG. 4B.

In this case, the low reflection film 9 is formed by a lamination of a first low reflection film 9X and a second low reflection film 9Y.

It is now assumed that the first low reflection film 9X has a refractive index $n_A$ and the second low reflection film 9Y has a refractive index $n_B$. For example, if $n_A > n_B$, it is possible to dispose the first low reflection film having a large refractive index as the lower layer of the laminated layers as shown in FIG. 4B, change the film thickness of the low reflection films 9X and 9Y according to the color, to thereby improve the sensitivity.

The lamination order of the low reflection film 9X having a large refractive index and the low reflection film 9Y having a small refractive index is not especially restricted. For example, a lamination order opposite to that of FIG. 4 may be used. Preferably, such a lamination order as to provide a more favorable signal is used.

Thus, according to the present invention, the sensitivity can be improved by using low reflection films 9 corresponding to colors irrespective of the film thickness and the arrangement.

As a concrete embodiment, the case where a SiN film formed by using the reduced pressure CVD system is used as the low reflection film 9 will now be described.

As for the film structure at this time, the film thickness of the low reflection film 9 is approximately 40 nm and the film thickness of the insulation film 13 is approximately 350 nm in FIG. 4A.

As for the low reflection film 9, it is now assumed that the silicon /$SiO_2$ /SiN film structure is dominant in the semiconductor substrate 10 and the insulation film 13, and the film thickness of the low reflection film 9 is 40 nm in this structure. The reflection factor which becomes minimum in the incident light wavelength of 600 to 620 nm is in the range of 1 to 2%.

In the case where the film thickness of the low reflection film 9 is 30 nm, the minimum wavelength is approximately 500 nm.

In the case where the low reflection film 9 is formed by a SiN film formed by using, for example, the reduced pressure CVD system, and the color filters 20, for example, of primary colors are provided, the maximum sensitivity can be obtained for respective colors by forming the low reflection film with a film thickness of approximately 45 nm for the red color, the low reflection film with a film thickness of approximately 35 nm for the green color, and the low reflection film with a film thickness of approximately 35 nm for the blue color.

In the same way as this, in the CCD solid state imaging device of three edition type, it is also possible to improve the sensitivity by fabricating three CCD solid state imaging devices with the above described film thickness for respective colors.

Also in the case of the combination of the low reflection films 9X and 9Y having different refractive indexes as shown in FIG. 4B, it is possible in the same way to select a combination of refractive index and film thickness providing the minimum reflection factor for the wavelength.

In the case where the color filter 20 of the complementary color system is used as the color filter 20, it becomes possible to conduct an adjustment by changing the film thickness by means of spectral diffraction.

Since the effect of improving the sensitivity is especially great in the green color, the film thickness is adjusted to become 35 nm for the green color and the film thickness is adjusted according to spectral diffraction for other colors. As a result, the maximum sensitivity improvement (increase of approximately 30%) can be obtained by improving the sensitivity in each color.

Furthermore, for the signal of each of spectrally diffracted colors, the degree of freedom of conditions set in the adjustment is increased. In other words, the signal processing is facilitated.

Furthermore, since the low reflection films are formed on the insulation film formed on the semiconductor substrate, they have an effect of blocking entry of a foreign substance into the semiconductor substrate of the light receiving portion. As a result, it is effective in suppressing the occurrence of white points which posed the problem heretofore.

In the above described embodiment, the present invention has been applied to the solid state imaging device having the matrix arrangement. Also to such a solid state imaging device that color filters having the same color are formed on photosensors arranged on the same one line and photosensors of a plurality of lines having color filters of different colors formed thereon are formed to correspond to a plurality of colors as in a so-called line sensor or the like, the present invention can be applied in the same way.

In this case as well, it is possible to improve the sensitivity and control the transmission factor for the light receiving portion to facilitate the signal processing by forming low reflection films differing in refractive index and film thickness at every line corresponding to each of the colors.

Another embodiment of the present invention will now be described.

In the solid state imaging device of the foregoing embodiment, the low reflection films were formed so as to differ in film thickness according to the pixel color. In the present embodiment, however, low reflection films having the same film thickness are formed for respective pixels.

In addition, hydrogen is contained in the upper protective layer film 19, the light shielding film 15 and the like located on the low reflection film 9 to form a film for supplying hydrogen.

Figure 5:
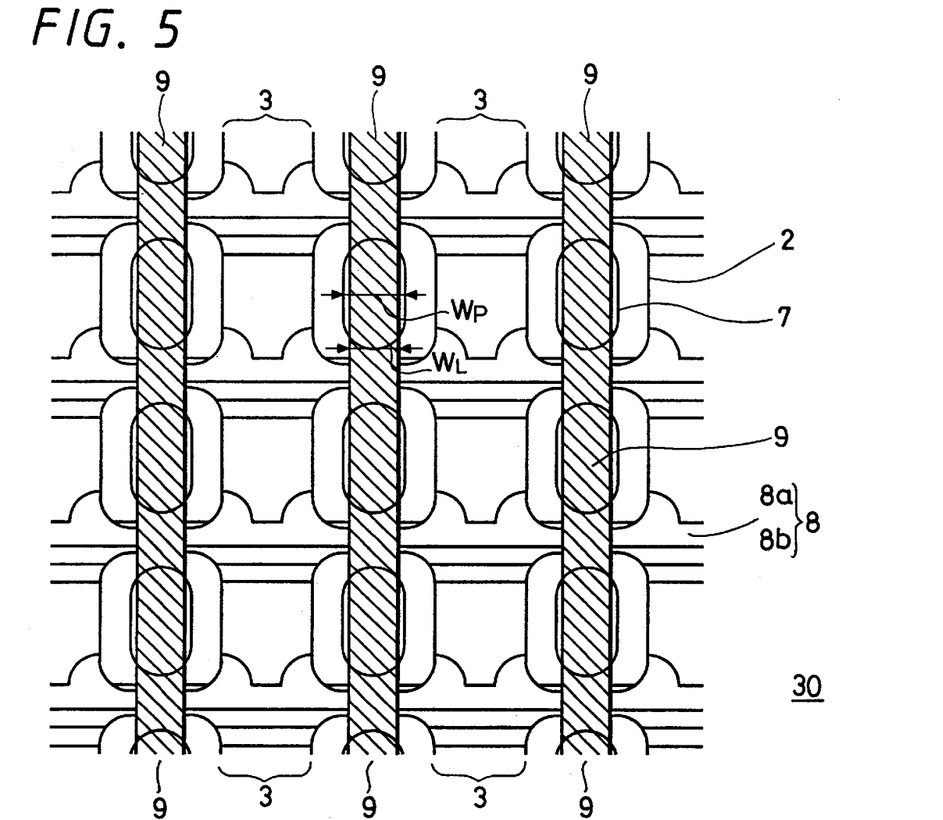
FIG. 5 is a plan view of an imaging region of another CCD solid state imaging device according to the present invention.

FIG. 5 shows the plan view of an imaging region of a solid state imaging device 30 of the present embodiment. As shown in FIG. 5, the low reflection films 9 are formed in a narrow band form so as to correspond to the columns of the light receiving portions 2. In addition, the low reflection films 9 are formed so as to have a width $W_L$ narrower than a width $W_P$ of the opening portion 7 located on the light receiving portion 2.

In the case where the low reflection films are formed on the entire face of the imaging region by the SiN (having a refractive index of 2.0) made by using the reduced pressure CVD system and the film thickness thereof is set in the range of 20 to 40 nm, the sensitivity is improved as compared with the conventional technique by approximately 20%. On the other hand, the dark current increases and becomes as much as five times as compared with the case where the low reflection films are not provided.

Since the low reflection films are formed entirely, the low reflection films suppress the supply of hydrogen from the upper protective layer film, the light shielding film and the like onto the substrate. Therefore, the interface level remains on the semiconductor substrate. This increases the dark current.

In the present embodiment shown in FIG. 5, the low reflection films 9 are formed so as to have the width $W_L$ narrower than the width $W_P$ of the opening portion 7 located on the light receiving portion 2. Therefore, the light incident on the opening portion 7 located on the light receiving portion 2 is suppressed from being reflected and directed upward. In addition, hydrogen is supplied from the upper protective layer film 19, the light shielding film 15 and the like to the semiconductor substrate 10 via the clearance between the opening portion 7 and the low reflection film 9 and via the vicinity of the transfer electrode 8 where the low reflection film 9 is not formed. Especially, via the clearance between the opening portion 7 and the low reflection film 9, hydrogen is supplied to the light receiving portion 2 as well. Therefore, the interface level can be eliminated more effectively.

As a result, the dark current can be decreased to approximately the same degree as the conventional solid state imaging device while maintaining the above described sensitivity improving effect.

After the low reflection films 9 have been formed entirely, a photoresist layer is formed thereon and the photoresist layer is subjected to patterning for removing the low reflection films. By using this photoresist layer as a mask, the low reflection films 9 are removed by etching. By providing such a process, the low reflection films 9 having the above described configuration can be formed so as to have the pattern shown in FIG. 5.

For the photoresist layer at this time, a resist containing a dye is preferably used for the purpose of preventing the shape of the resist from being destroyed by light reflected from the transfer electrode at the time of exposure.

In the etching process, large reduction of the $SiO_2$ film on the substrate caused by etching deteriorates the characteristics such as white points, darkness and so on.

By using such an etching condition or an apparatus that the etching selection ratio between the low reflection film and the $SiO_2$ film is large, therefore, the film reduction of the $SiO_2$ film is decreased.

Furthermore, since the low reflection films 9 have the width $W_L$ narrower than the width $W_P$ of the opening portions 7 as described above, the low reflection films 9 can be formed so as to be self-aligned to the opening portions.

Therefore, it is possible to reduce the output difference depending upon the pixel position caused by misalignment of the low reflection film 9 which is in turn caused by misalignment of the mask using the photoresist layer.

Still another embodiment of the solid state imaging device according to the present invention will now be described.

Figure 6:
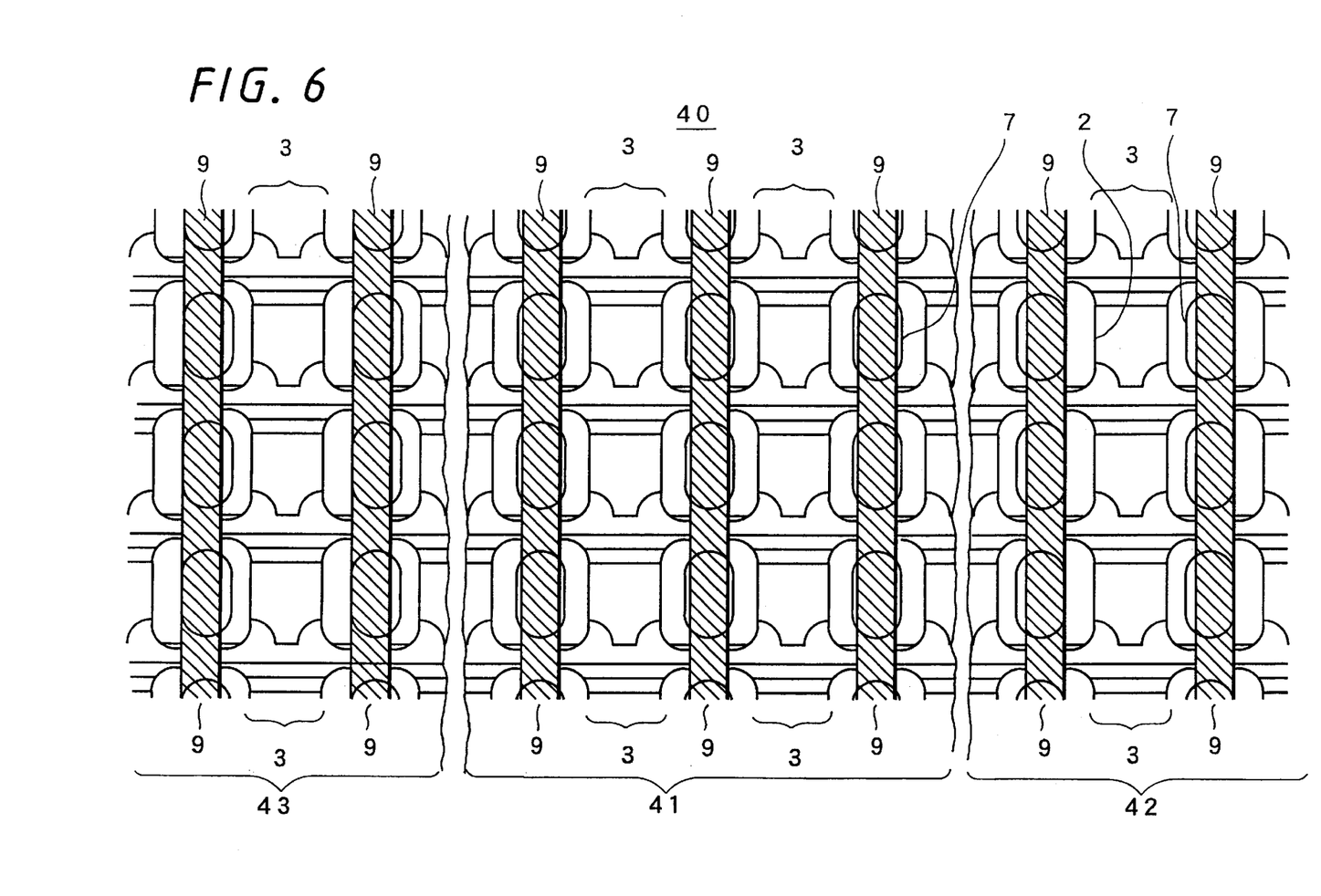
FIG. 6 is a plan view of an imaging region of a still another CCD solid state imaging device according to the present invention.

In the foregoing embodiment 30 shown in FIG. 5, the low reflection film 9 was formed in the center of the opening portion located on the light receiving portion. As illustrated in FIG. 6 showing the plan view of the imaging region of a solid state imaging device 40 of this embodiment, the low reflection films 9 of pixels located in a central portion 41 are formed in the center of the opening portion 7 on the light receiving portion 2, whereas the low reflection films 9 of pixels in the peripheral portions 42 and 43 are formed so as to be displaced from the center of the opening portion 7 on the light receiving portion 2 to the outside.

In other words, the low reflection films 9 are disposed so as to be displaced from the center of each opening portion 7 to the right side in pixels 42 located on the right side of the central portion 41. The low reflection films 9 are disposed so as to be displaced from the center of each opening portion 7 to the left side in pixels 43 located on the left side of the central portion 41.

In the case where the light incident from a light source upon a solid state imaging device is not a parallel light but comes from a point light source, such a configuration can cope with a difference in an incident angle between the pixels 41 of the central portion and the pixels 42 and 43 of the peripheral portions.

Figure 7:
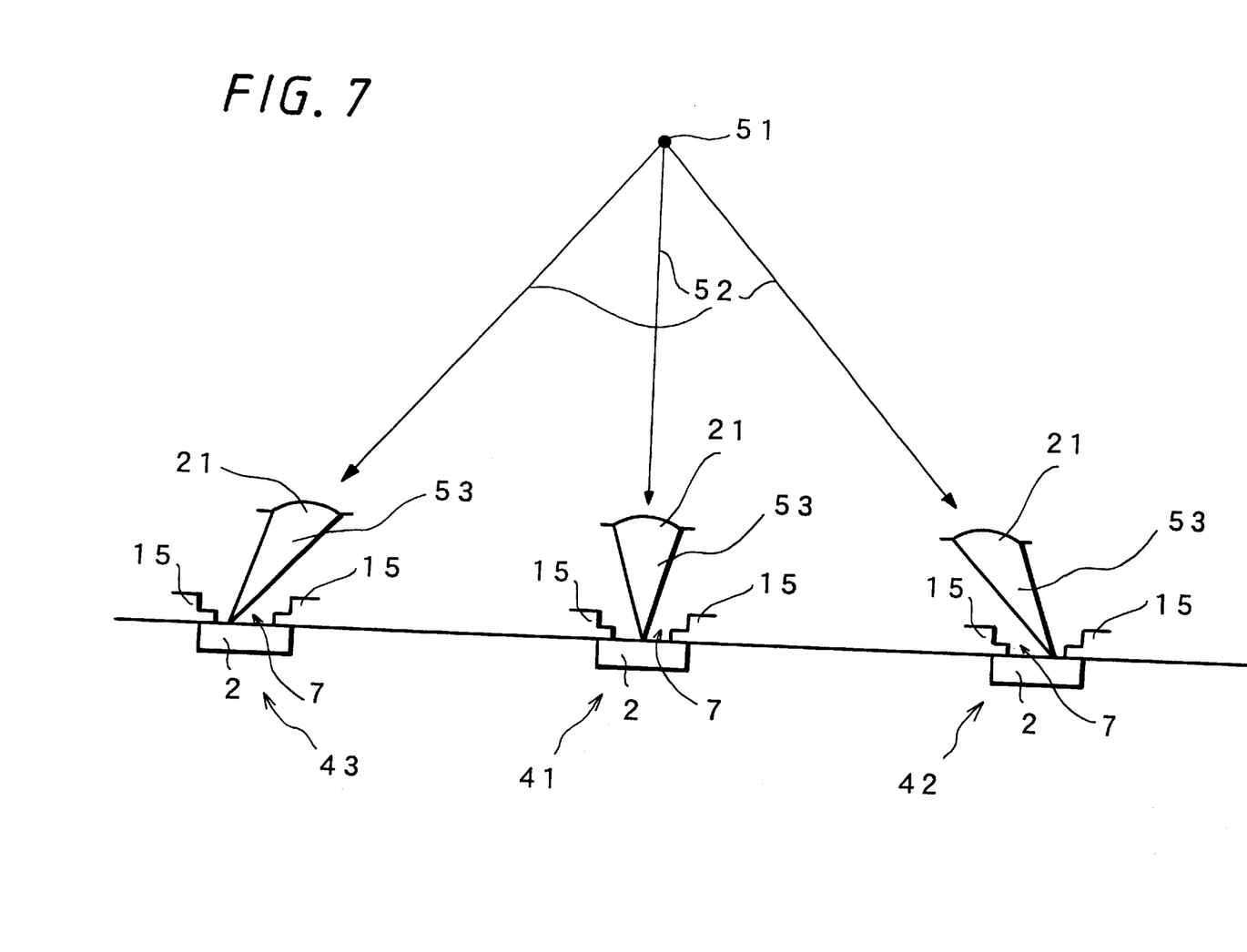
FIG. 7 is a diagram illustrating the states of a light incident upon a pixel located in a central portion and pixels located in peripheral portions.

FIG. 7 shows states of the light incident upon the pixels 41 in the central portion and the pixels 42 and 43 of the peripheral portions in the case of a point light source.

Light 52 from a point light source 51 such as a pinhole formed by a diaphragm or the like is made incident upon the pixels 41 of the central portion straight and incident upon the center of the opening portion 7 on the light receiving portion 2. However, the light 52 is made incident obliquely upon the pixels 42 and 43 of the peripheral portions. In each of the pixels 42 and 43 of the peripheral portions, therefore, a microlens 21 is formed so as to be displaced from the right above the opening portion 7 to the inside so that light 53 transmitted and focused through the microlens 21 will be made incident upon the portion within the opening portion 7 on the light receiving portion 2. At this time, the position of the microlens 21 is set so that the light 53 incident from the microlens 21 upon the light receiving portion 2 will not be intercepted by the light shielding film 15. Therefore, the light 53 is made incident upon the outside, portion from the center of the opening portion 7.

In the pixels 42 and 43 of the peripheral portions included in the solid state imaging device 40 of the present embodiment, the low reflection film 9 is formed so as to be displaced from the center of the opening portion 7 toward the outside in correspondence with the light 53 shown in FIG. 7. Thereby, it is possible to effectively suppress the reflection even for the obliquely incident light 53 as shown in FIG. 7 and improve the sensitivity.

According to the above described solid state imaging device of the present invention, the sensitivity can be improved by forming the low reflection films on the opening portions.

Furthermore, by changing the conditions of the film thickness and refractive index of each of the low reflection films according to the filter of each color, the maximum sensitivity improvement can be obtained for each color.

Furthermore, it is possible to improve the degree of freedom of adjustment for the signal of each color and make the signal processing easier.

Furthermore, since the low reflection films are formed on the insulation film formed on the semiconductor substrate in the present invention, they have an effect of blocking entry of a foreign substance into the semiconductor substrate of the light receiving portion. As a result, it is possible to suppress the occurrence of white points.

Furthermore, since a film supplying hydrogen is provided in the upper film of the low reflection layer in the present invention, it is possible to supply hydrogen to the semiconductor substrate, reduce the interface level on the surface of the substrate, and reduce the dark current caused thereby.

When a part of the low reflection film is removed and thereby the width of the low reflection film is made narrower than the width of the opening on the light receiving portion, it becomes possible to supply hydrogen to the light receiving portion of the semiconductor substrate from an upper layer while maintaining the sensitivity improving effect. As a result, it becomes possible to effectively prevent the dark current from being increased by the interface level and the like.

At this time, a low reflection film is not disposed under the projection portion of the light shielding film. Therefore, the smear can be reduced.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid state imaging device comprising:
    a light shielding film containing a hydrogen source, and having therein a light receiving portion formed as a pixel, said light receiving portion having an opening portion; and
    a low reflection film extending across said opening portion of said light receiving portion and having a clearance between said low reflection film and said opening portion.

2. The solid state imaging device of claim 1 wherein said light shielding film containing a hydrogen source comprises aluminum containing hydrogen.

3. A solid state imaging device carried by a semiconductor substrate comprising:
    a light shielding film, having therein a light receiving portion formed as a pixel, said light receiving portion having an opening portion; and
    a low reflection film extending across said opening portion of said light receiving portion;
    wherein a light incident upon said light receiving portion has a plurality of colors selected for respective pixels, and
    said low reflection film has a film thickness selected for each pixel so as to correspond to a color of a light incident upon said light receiving portion.

4. A solid state imaging device according to claim 3, wherein the film thickness of said low reflection films having said refractive index is changed pixel by pixel so as to correspond to the color of the light incident upon said light receiving portion.

5. A solid state imaging device comprising:
    a light shielding film having therein a light receiving portion formed as a pixel, said light receiving portion having an opening portion;
    a low reflection film extending across said opening portion of said light receiving portion and having a clearance between said low reflection film and said opening portion; and
    a film to supply hydrogen via said clearance between said opening portion and said low reflection film to said semiconductor substrate, said film to supply hydrogen provided in an upper layer above said low reflection film.

6. A solid state imaging device according to claim 5, wherein said low reflection film is formed so as to be narrower in width that said opening portion of said light receiving portion.

7. A solid state imaging device according to claim 6, wherein in a pixel of a central portion said low reflection film is formed in a center of said opening portion of said light receiving portion, whereas in a pixel of a peripheral portion said low reflection film is formed so as to be displaced from the center of said opening portion of said light receiving portion to an outside.

* * * * *